United States Patent
Li et al.

(10) Patent No.: US 10,357,941 B2
(45) Date of Patent: Jul. 23, 2019

(54) SYSTEMS AND METHODS FOR REINFORCED ADHESIVE BONDING

(71) Applicant: GM Global Technology Operations LLC, Detroit, MI (US)

(72) Inventors: Yongqiang Li, Rochester, MI (US); Blair E. Carlson, Ann Arbor, MI (US); Xin Yang, Beijing (CN); Jianfeng Wang, Jiangsu (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 281 days.

(21) Appl. No.: 15/302,852

(22) PCT Filed: Jul. 28, 2014

(86) PCT No.: PCT/CN2014/083108
§ 371 (c)(1),
(2) Date: Oct. 7, 2016

(87) PCT Pub. No.: WO2015/154348
PCT Pub. Date: Oct. 15, 2015

(65) Prior Publication Data
US 2017/0028678 A1 Feb. 2, 2017

Related U.S. Application Data

(63) Continuation of application No. PCT/CN2014/074945, filed on Apr. 9, 2014.

(51) Int. Cl.
*B23K 31/02* (2006.01)
*B32B 7/12* (2006.01)
(Continued)

(52) U.S. Cl.
CPC .............. *B32B 7/12* (2013.01); *B23K 1/0008* (2013.01); *B23K 1/20* (2013.01); *B23K 35/0233* (2013.01);
(Continued)

(58) Field of Classification Search
CPC ........... B32B 7/12; B32B 5/028; B32B 15/08; B32B 37/12; B32B 37/06; B32B 27/365;
(Continued)

(56) References Cited

U.S. PATENT DOCUMENTS 3,358,898 A * 12/1967 Medkeff ............ B23K 35/0222
138/99
3,740,281 A * 6/1973 Fujiwara ........... B32B 17/10036
156/106
(Continued)

FOREIGN PATENT DOCUMENTS

| CN | 1811090 A | 8/2006 |
| CN | 203403555 U | 1/2013 |

(Continued)

*Primary Examiner* — Kiley S Stoner

(57) ABSTRACT

The present disclosure relates to a bonding system (100) comprising an adhesive (200), in contact with a first contact surface (115) and a second contact surface (125), and a solder mesh (310) positioned in the adhesive (200) in contact with the first contact surface (115). Also, the present disclosure relates to a bonding method to produce a solder-reinforced adhesive bond joining a first substrate (110) and a second substrate (120), comprising applying, on a first contact surface (115) of the first substrate (110), an adhesive (200), positioning, at least partially into the adhesive (200), a solder mesh (310), such that the solder mesh (310) contacts the first contact surface (115), connecting, to a portion of the adhesive (200) opposite the first contact surface (115), a second contact surface (125) of the second substrate (120), and applying heat to the first contact surface (115) such that at least one portion of the solder mesh (310) reaches a solder-bonding temperature.

14 Claims, 9 Drawing Sheets

(51) Int. Cl.
*H05K 3/36* (2006.01)
*B32B 27/08* (2006.01)
*B32B 27/32* (2006.01)
*B32B 27/36* (2006.01)
*B32B 3/26* (2006.01)
*B32B 37/06* (2006.01)
*B32B 37/12* (2006.01)
*B23K 1/00* (2006.01)
*B23K 1/20* (2006.01)
*B23K 35/02* (2006.01)
*B32B 5/02* (2006.01)
*B32B 15/08* (2006.01)
*H05K 3/32* (2006.01)

(52) U.S. Cl.
CPC .............. *B32B 3/266* (2013.01); *B32B 5/028* (2013.01); *B32B 15/08* (2013.01); *B32B 27/08* (2013.01); *B32B 27/32* (2013.01); *B32B 27/365* (2013.01); *B32B 37/06* (2013.01); *B32B 37/12* (2013.01); *H05K 3/368* (2013.01); *B32B 2255/06* (2013.01); *B32B 2255/26* (2013.01); *B32B 2262/103* (2013.01); *B32B 2307/54* (2013.01); *B32B 2307/542* (2013.01); *B32B 2605/08* (2013.01); *H05K 3/323* (2013.01); *H05K 2203/041* (2013.01)

(58) Field of Classification Search
CPC ......... B32B 27/08; B32B 3/266; B32B 37/32; B32B 2262/103; B32B 2605/08; B32B 2255/06; B32B 2255/26; B32B 2307/54; B32B 2307/542; B23K 1/20; B23K 1/0008; B23K 35/0233; H05K 3/368; H05K 2203/041; H05K 3/323; H05K 3/305
USPC .................. 228/245–262, 175–176
See application file for complete search history.

(56) References Cited

U.S. PATENT DOCUMENTS

| | | | |
|---|---|---|---|
| 4,314,231 A | 2/1982 | Walty | |
| 4,587,175 A * | 5/1986 | Akao | B32B 3/266 428/596 |
| 4,698,275 A * | 10/1987 | Holt | H05K 3/222 428/209 |
| 5,677,045 A * | 10/1997 | Nagai | B32B 27/12 174/148 |
| 5,704,116 A | 1/1998 | Gamota et al. | |
| 6,119,924 A * | 9/2000 | Toi | B23K 20/023 228/179.1 |
| 6,221,795 B1 * | 4/2001 | Sikorski | B29C 70/025 442/19 |
| 7,658,663 B2 * | 2/2010 | Aisenbrey | A63H 30/04 156/441 |
| 2002/0005398 A1 * | 1/2002 | Gillner | B32B 17/10036 219/203 |
| 2002/0121334 A1 * | 9/2002 | Ikeda | B32B 5/18 156/246 |
| 2003/0067056 A1 * | 4/2003 | Araki | H01L 23/145 257/635 |
| 2004/0050911 A1 * | 3/2004 | Lee | B23K 3/0607 228/180.22 |
| 2005/0056365 A1 * | 3/2005 | Chan | H01L 23/3733 156/307.7 |
| 2005/0178496 A1 * | 8/2005 | Aisenbrey | B29C 45/0013 156/244.11 |
| 2007/0175568 A1 * | 8/2007 | Wang | B23K 1/0008 156/155 |
| 2010/0300507 A1 * | 12/2010 | Heng | H01L 31/1804 136/244 |
| 2010/0315789 A1 * | 12/2010 | Sato | H01R 13/2414 361/729 |
| 2011/0026864 A1 * | 2/2011 | Than Trong | F16C 17/02 384/420 |
| 2011/0038124 A1 * | 2/2011 | Burnham | H01L 23/3737 361/717 |
| 2011/0225821 A1 * | 9/2011 | Tai | B32B 7/12 29/877 |
| 2011/0272454 A1 * | 11/2011 | Nishimura | B23K 3/063 228/256 |
| 2016/0107419 A1 * | 4/2016 | Chiang | B32B 15/08 428/141 |

FOREIGN PATENT DOCUMENTS

| | | | |
|---|---|---|---|
| CN | 203429810 U | | 2/2014 |
| FR | 1478617 A | * | 3/1966 |
| JP | 2000-030847 A | * | 1/2000 |

* cited by examiner

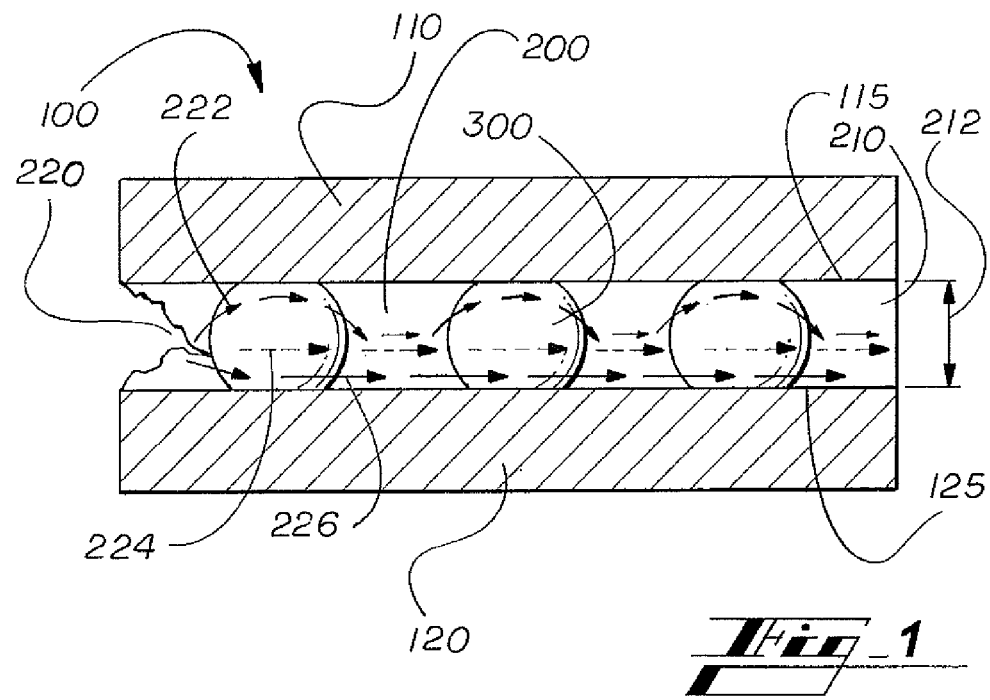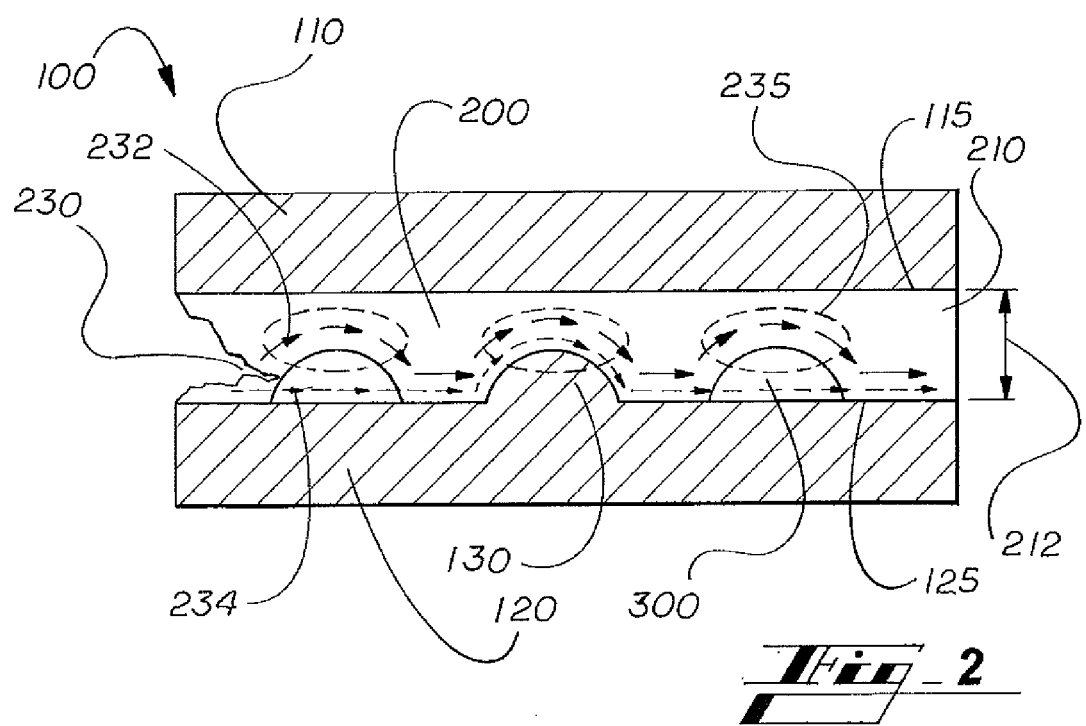

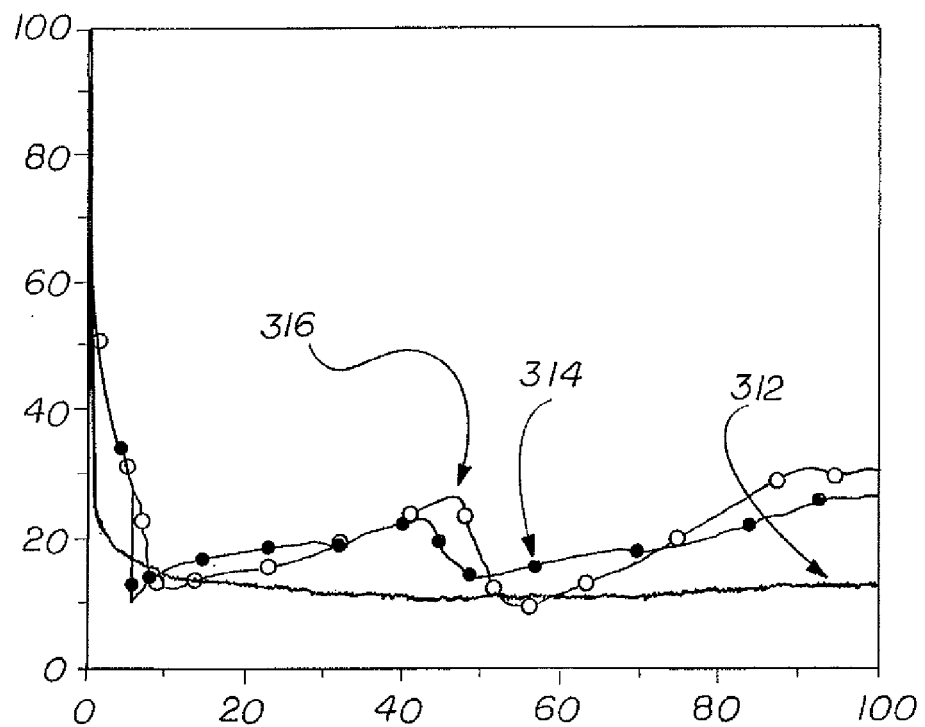
Fig_4
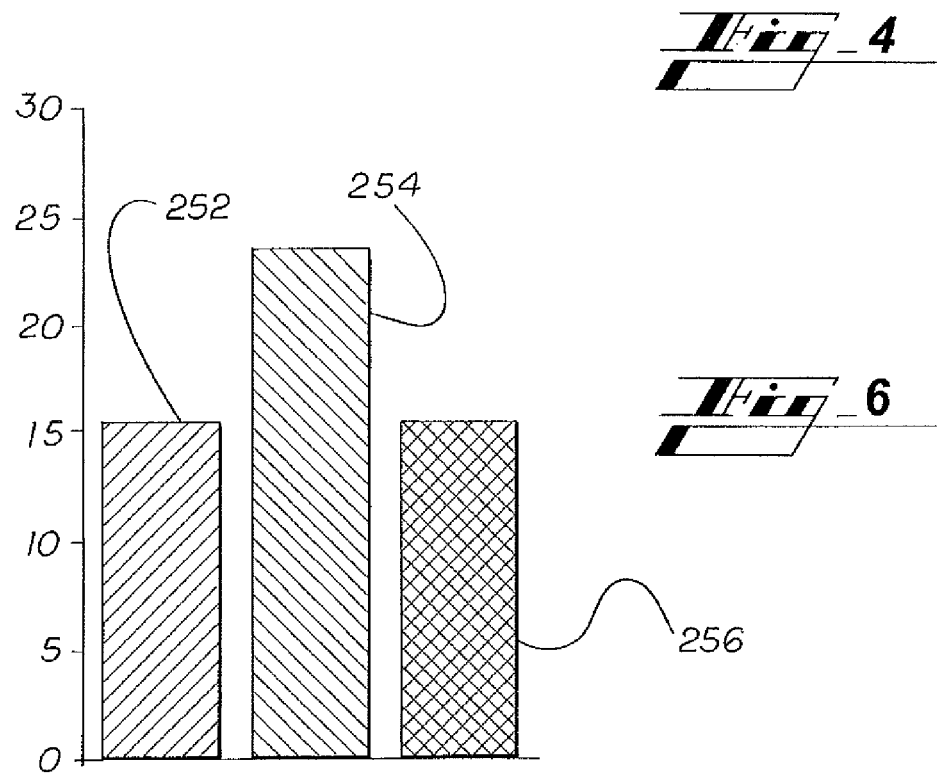
Fig_6

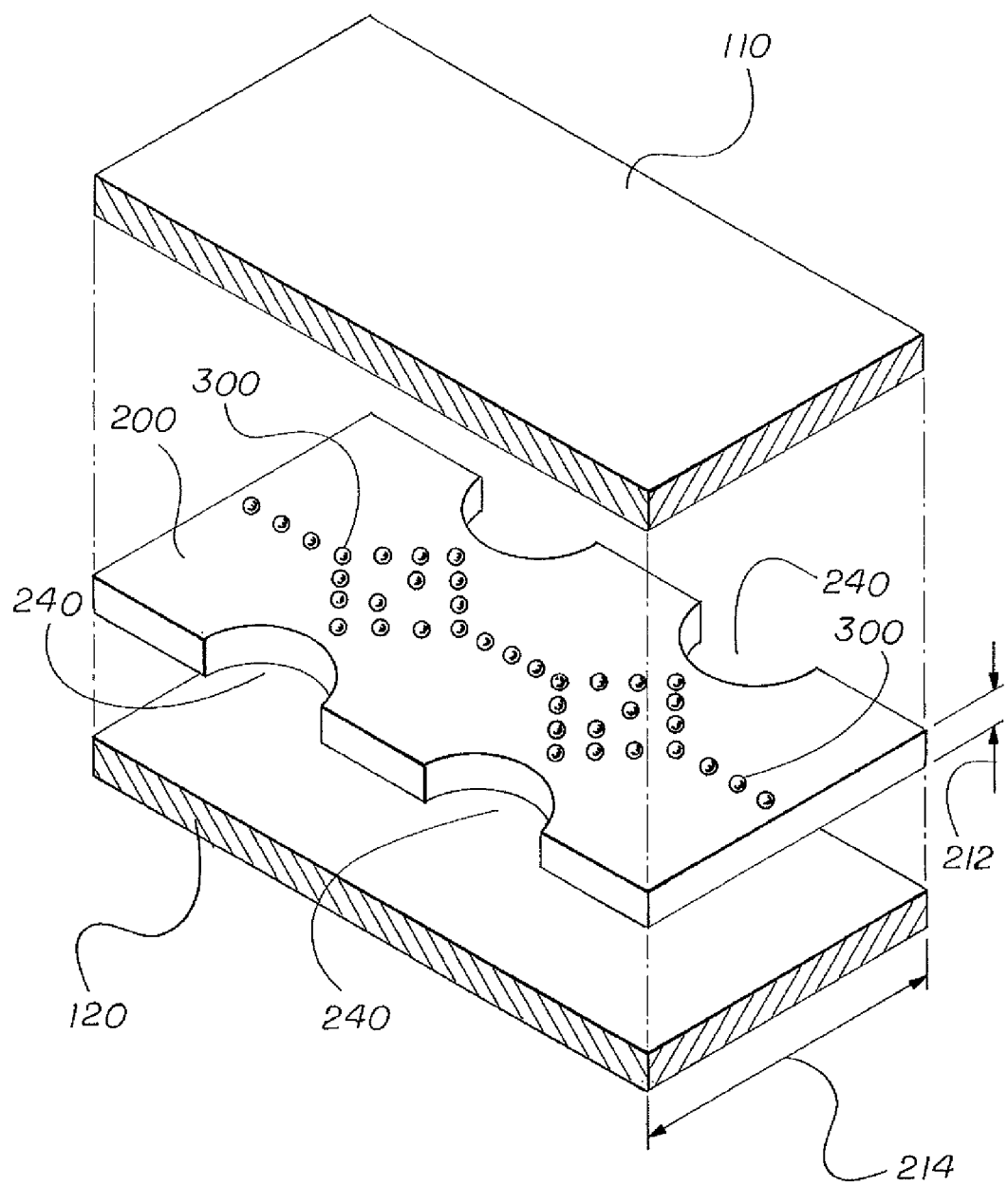
Fig_5

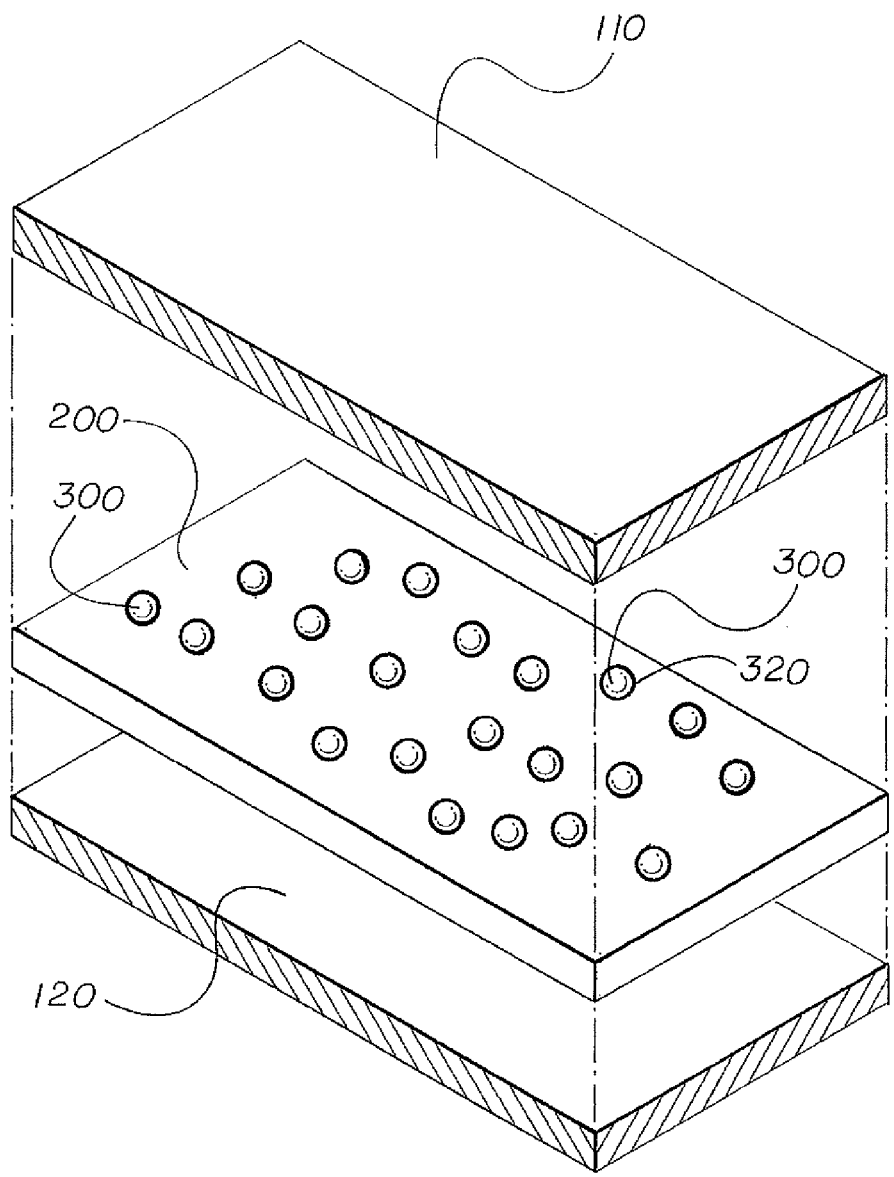
Fig_7

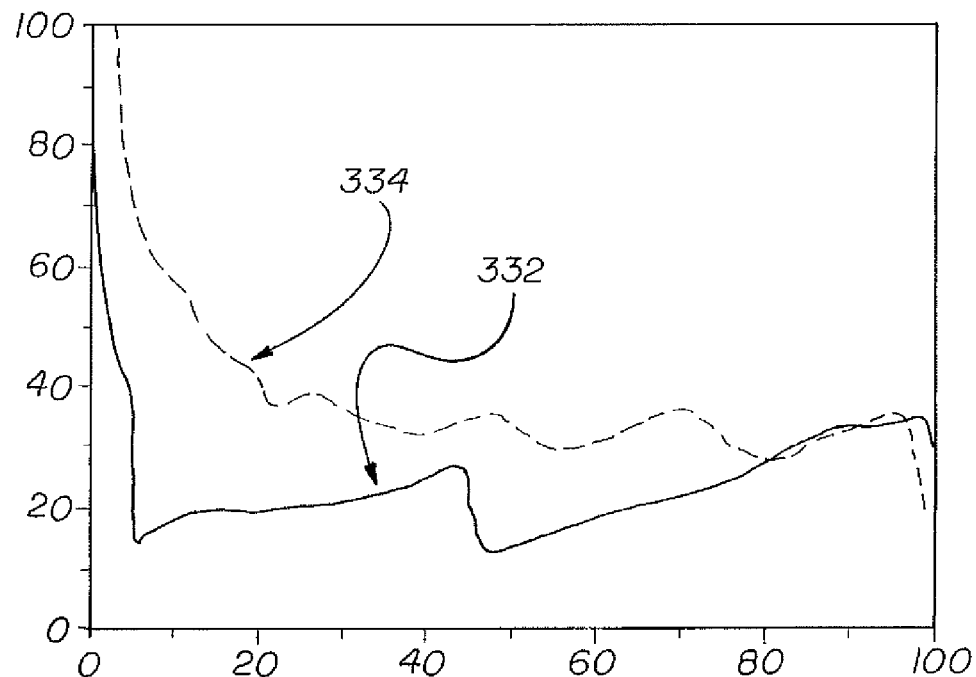
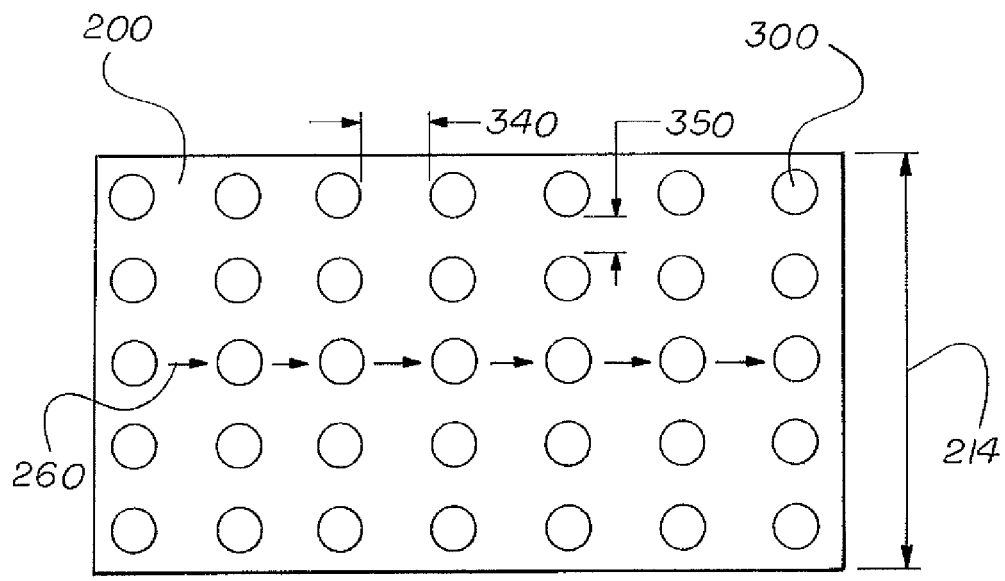

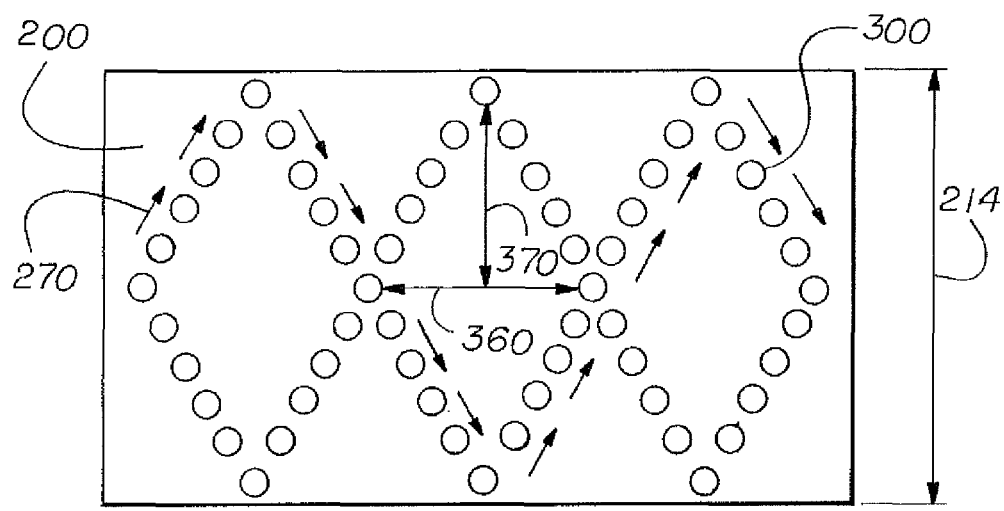
Fig_10
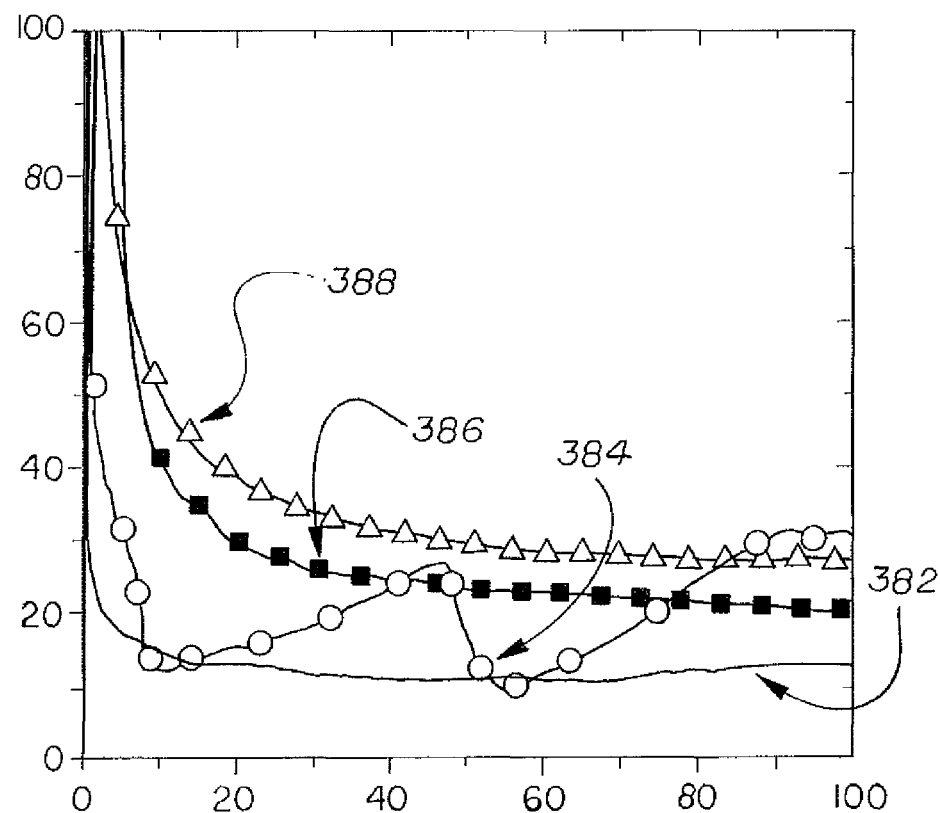
Fig_11

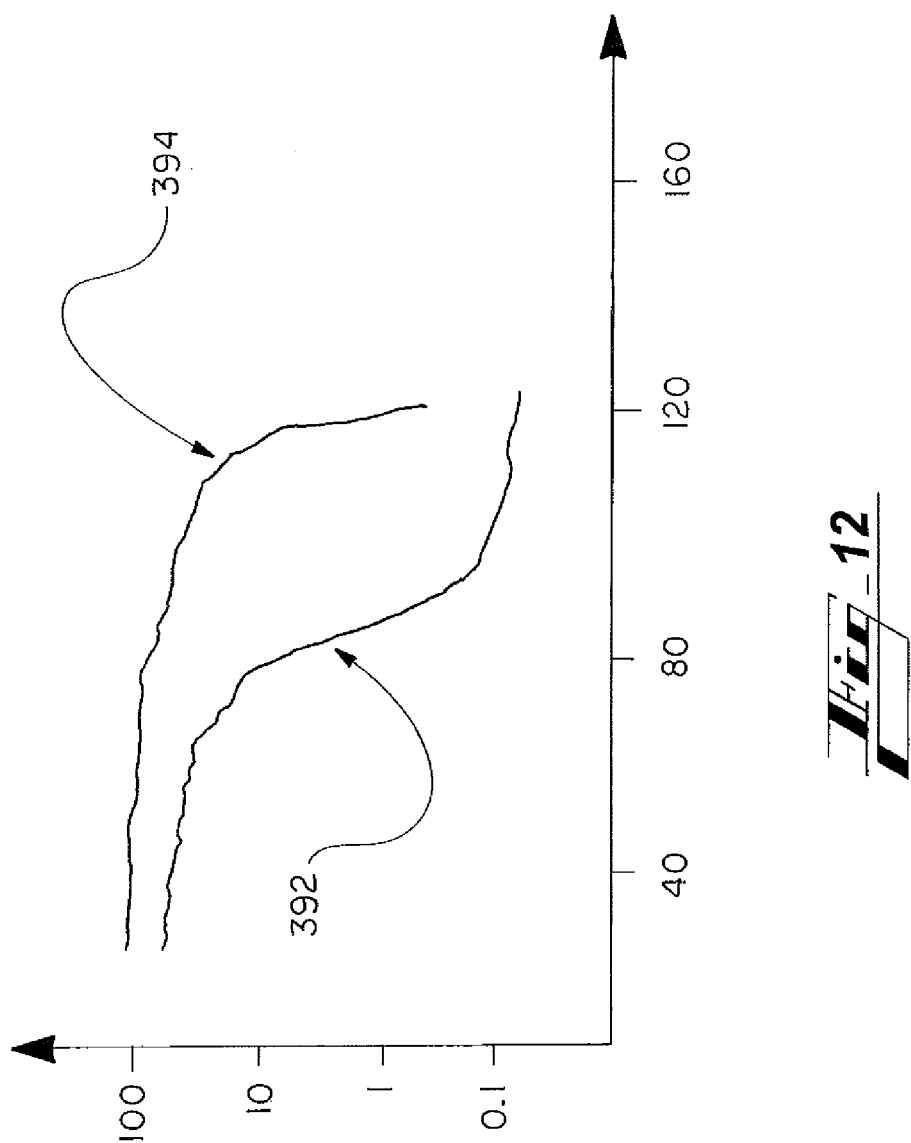

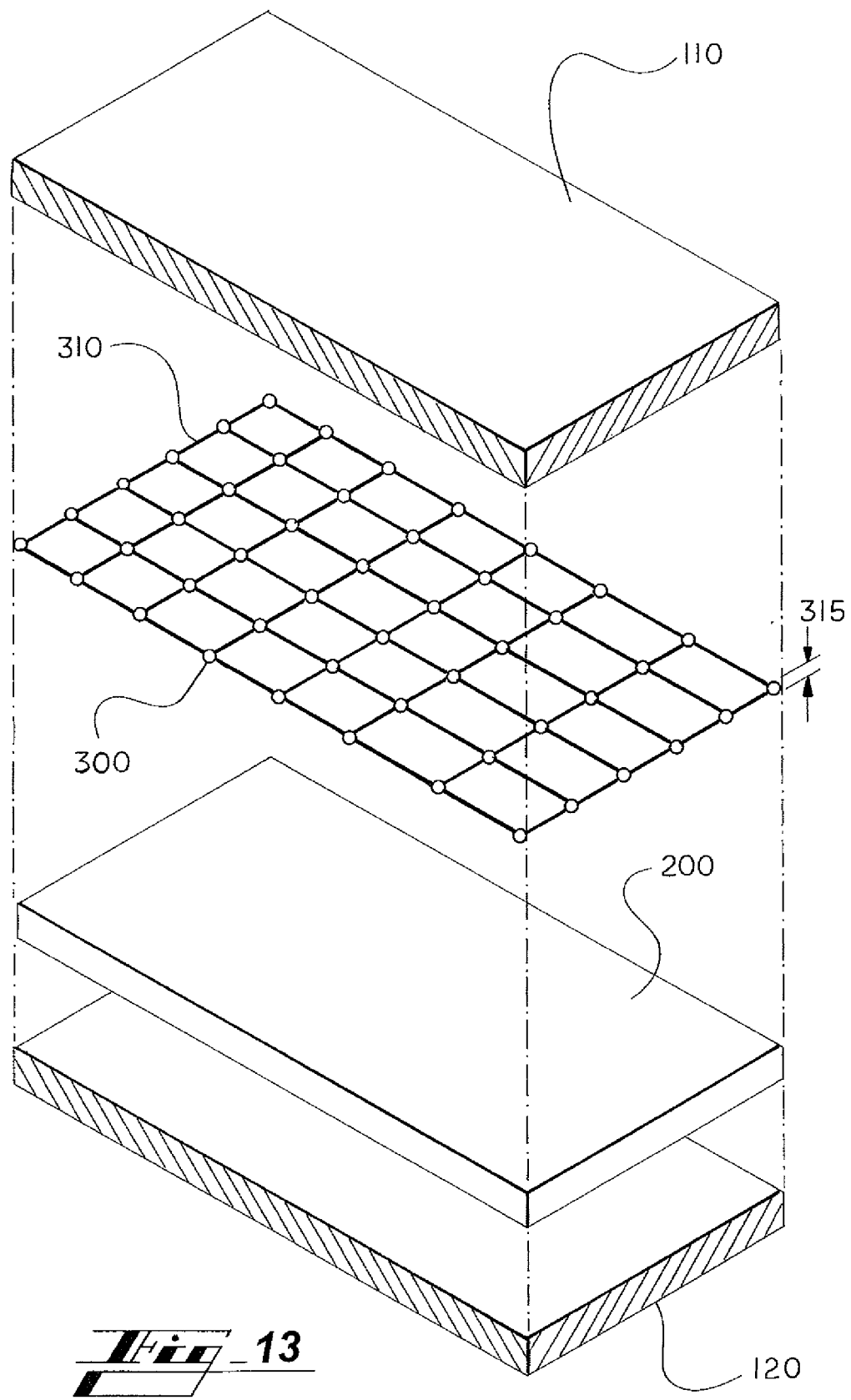
Fig_13

SYSTEMS AND METHODS FOR REINFORCED ADHESIVE BONDING

CROSS-REFERENCE TO RELATED APPLICATIONS

This application claims priority to International application No. PCT/CN2014/074945, filed Apr. 9, 2014, and titled "Systems and Methods for Reinforced Adhesive Bonding," which application in its entirety is incorporated by reference herein.

TECHNICAL FIELD

The present technology relates to adhesive bonding for substrate materials. More specifically, the technology provides reinforced adhesive bonding in various ways through the use of solder material.

BACKGROUND

Structural adhesives replace welds and mechanical fasteners in many applications because structural adhesives reduce fatigue and failure commonly found around welds and fasteners. Structural adhesives can also be preferable to welds and mechanical fasteners where resistance to flex and vibration is desired.

Adhesive bonding uses structural adhesives to connect a substrate surface of one material to another substrate surface of the same material or a different material. Adhesive bonding is widely used in applications in which joining of dissimilar materials are required or in applications requiring the absence of electric voltage and current. Additionally, adhesive bonding may help improve corrosion resistance through eliminating substrate material contact with fasteners and other corrosive elements.

When structural adhesives are applied to substrate surfaces, a bond line forms at the meeting of the substrate surfaces. Uniformity within the bond line is an important factor for optimal adhesive performance, thus dictating that bond line thickness is critical in designing a bond joint.

When substantial force exists, structural adhesives used in adhesive bonding may be loaded (1) normal to the bond line, which creates a peeling effect causing substrate materials to be on different planes (i.e., peel fracture), or (2) perpendicular to the leading edge of a fracture, whether in-plane or out-of-plane, which creates a shearing effect where substrate materials remain on the same plane (i.e., shear fracture). While fracturing is typically avoided, if there is to be fracturing, shear fracture is preferred over peel fracture because shear fracture requires an external loading that is greater than that of peel fracture to produce failure.

Glass beads may be added to some structural adhesives to ensure bond line uniformity for adequate bond line thickness control. However, the use of glass beads may cause strength issues within the structural adhesive because glass beads do not bond to substrate materials.

SUMMARY

A need exists for a structural adhesive that creates bond line uniformity and promotes fracture propagation along a fracture path requiring the greatest amount of fracture energy. The present disclosure relates to systems and methods for establishing a structural adhesive that creates bond line uniformity and improves adhesive joint strength by facilitating a fracture path with the greatest amount of fracture energy.

In one aspect, the present technology includes a bonding system comprising (i) an adhesive, in contact with a first contact surface of a first substrate and a second contact surface of a second substrate, and (ii) a solder mesh positioned at least partially in the adhesive, with at least one portion of the solder mesh being in contact with the first contact surface.

In some embodiments, the solder mesh is positioned in a distribution (i) arresting crack propagation or (ii) promoting crack propagation along a path requiring, in at least one section of the system, a greatest amount of fracture energy.

In some embodiments, the solder comprises a coating configured to (i) arrest crack propagation in the adhesive or (ii) deflect crack propagation to promote failure in a shear direction through the adhesive adjacent the at least one portion of the solder mesh.

In some embodiments, the solder mesh is further positioned in contact with the second contact surface.

In a further aspect, the present technology includes a method, to produce a solder-reinforced adhesive bond joining a first substrate and a second substrate, comprising (i) applying, on a first contact surface of the first substrate, an adhesive, (ii) positioning, at least partially into the adhesive, a solder mesh, such that the solder mesh contacts the first contact surface, (iii) connecting, to a portion of the adhesive opposite the first contact surface, a second contact surface of the second substrate; and (iv) applying heat to the first contact surface such that at least one portion of the solder mesh reaches a solder-bonding temperature.

In some embodiments, the solder mesh is positioned in a distribution (i) arresting crack propagation or (ii) promoting crack propagation along a path requiring, in at least one section of the bond, a greatest amount of fracture energy.

In some embodiments, the solder comprises a coating configured to (i) arrest crack propagation in the adhesive or (ii) deflect crack propagation to promote failure in a shear direction through the adhesive adjacent the at least one portion of the solder mesh.

In some embodiments, wherein the solder mesh is further positioned in contact with the second contact surface.

Some embodiments, further comprise applying heat to the second contact surface such that the at least one portion of the solder mesh reaches the solder-bonding temperature.

In a further aspect, the present technology includes a method, to produce a solder-reinforced adhesive bond joining a first substrate and a second substrate, comprising (i) positioning, a first surface of a solder mesh in contact with the first contact surface of the first substrate, (ii) applying, on a second surface of the solder mesh, opposite the first surface of the solder mesh, an adhesive, (iii) connecting, to a portion of the adhesive, opposite the first contact surface, a second contact surface of the second substrate, and (iv) applying heat to the first contact surface such that at least one portion of the solder mesh reaches a solder-bonding temperature.

In some embodiments, the solder mesh is positioned in a distribution (i) arresting crack propagation or (ii) promoting crack propagation along a path requiring, in at least one section of the bond, the greatest amount of fracture energy.

In some embodiments, the solder mesh comprises a coating configured to (i) arrest crack propagation in the adhesive or (ii) deflect crack propagation to promote failure in a shear direction through the adhesive adjacent the at least one portion of the solder mesh.

In some embodiments, one or more of the plurality of solder particles are further positioned in contact with the second contact surface.

Some embodiments, further comprise applying heat to the second contact surface such that the at least one portion of the solder mesh reaches the solder bonding-temperature.

Other aspects of the present technology will be in part apparent and in part pointed out hereinafter.

DESCRIPTION OF THE DRAWINGS

FIG. 1 illustrates a side view of an exemplary embodiment of a bonding system.

FIG. 2 illustrates a side view of an alternate embodiment of the bonding system of FIG. 1.

FIG. 4 is a graph illustrating load and displacement of adhesives with (i) no solder balls, (ii) solder balls in contact with one substrate surface of FIG. 2, and (iii) solder balls in contact with both substrate surfaces of FIG. 1.

FIG. 5 illustrates an exploded perspective view of an exemplary embodiment of the bonding system containing solder balls with a gathered distribution and a reduced adhesive volume.

FIG. 6 is a graph illustrating energy absorption of adhesives containing (i) no solder balls, (ii) the solder ball configuration of FIGS. 1 and 2, and (iii) the solder ball configuration with a reduced adhesive bond line thickness of FIG. 4.

FIG. 7 illustrates an exploded perspective view of the exemplary embodiment of the bonding system containing solder balls with a random distribution and a solder ball coating.

FIG. 8 is a graph illustrating load and displacement of (i) the embodiment of FIG. 1 containing solder balls without coating and (ii) the embodiment of FIG. 6 containing solder balls with coating.

FIG. 9 illustrates top view of an embodiment of the bonding system containing solder balls with a linear distribution.

FIG. 10 illustrates an alternate embodiment of the bonding system of containing solder balls with a meandering distribution.

FIG. 11 illustrates load and displacement of adhesives with (i) no solder balls, (ii) solder balls containing a random distribution of FIG. 6, (iii) solder balls containing a linear distribution of FIG. 8, and (iv) solder balls containing a meandering distribution of FIG. 9.

FIG. 12 is a graph illustrating strength of adhesives containing (i) thermoplastic material and (ii) thermoplastic material including the solder material.

FIG. 13 illustrates an exploded perspective view of the exemplary embodiment of the bonding system containing a solder mesh.

DETAILED DESCRIPTION

Figure 3:
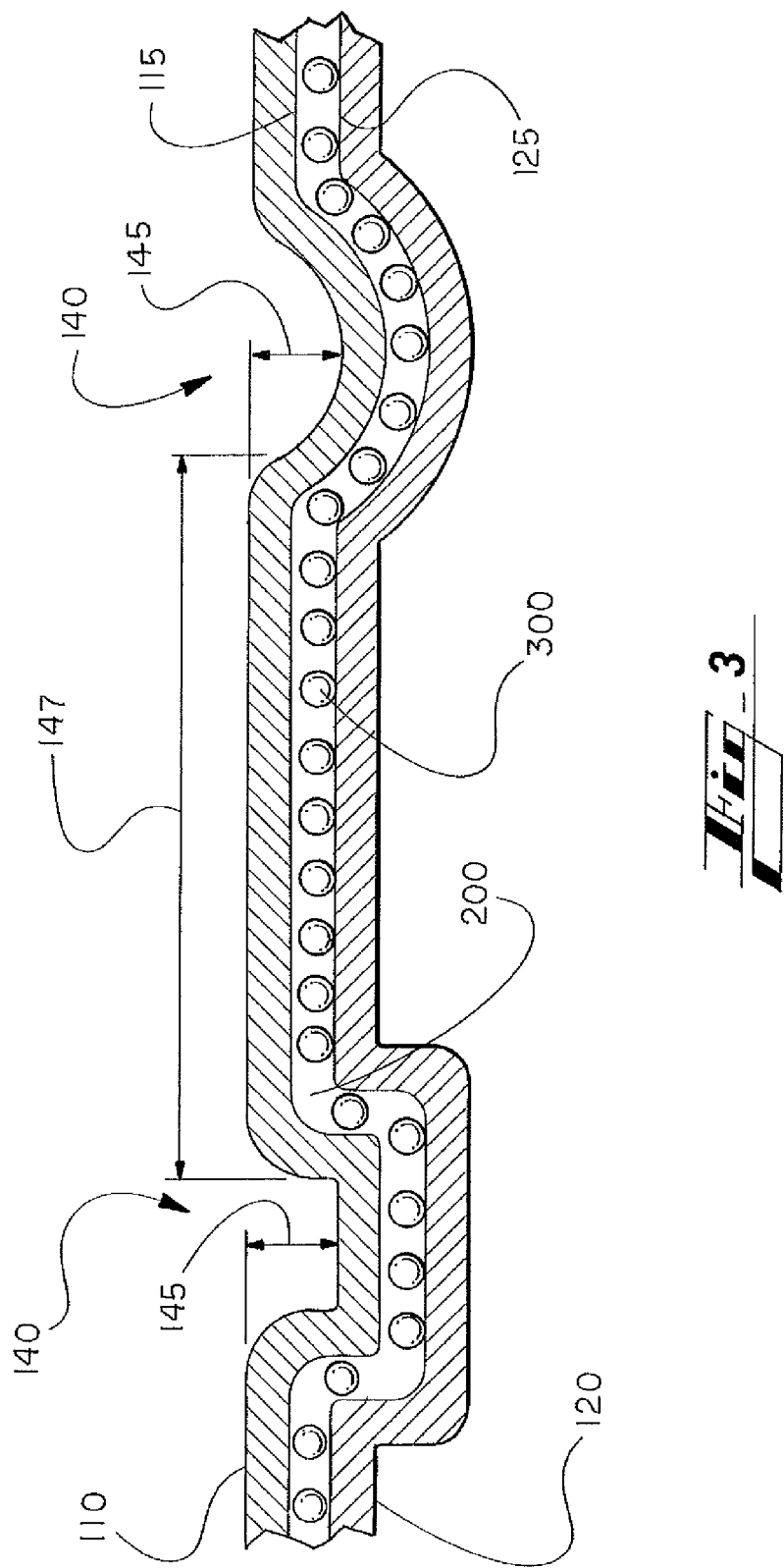
FIG. 3 illustrates a side view of an alternative embodiment of the bonding system of FIG. 1.

As required, detailed embodiments of the present disclosure are disclosed herein. The disclosed embodiments are merely examples that may be embodied in various and alternative forms, and combinations thereof. As used herein, for example, exemplary, illustrative, and similar terms, refer expansively to embodiments that serve as an illustration, specimen, model or pattern.

Descriptions are to be considered broadly, within the spirit of the description. For example, references to connections between any two parts herein are intended to encompass the two parts being connected directly or indirectly to each other. As another example, a single component described herein, such as in connection with one or more functions, is to be interpreted to cover embodiments in which more than one component is used instead to perform the function(s). And vice versa—i.e., descriptions of multiple components described herein in connection with one or more functions are to be interpreted to cover embodiments in which a single component performs the function(s).

In some instances, well-known components, systems, materials, or methods have not been described in detail in order to avoid obscuring the present disclosure. Specific structural and functional details disclosed herein are therefore not to be interpreted as limiting, but merely as a basis for the claims and as a representative basis for teaching one skilled in the art to employ the present disclosure.

While the present technology is described primarily in connection with manufacturing components of a vehicle in the form of an automobile, it is contemplated that the technology can be implemented in connection with manufacturing components of other vehicles, such as marine craft and air craft, and non-vehicle apparatus.

I. Bonding System

Now turning to the figures, and specifically to the first figure, FIG. 1 illustrates the cross sectional view of a bonding system identified by reference numeral 100. The bonding system 100 includes a structural adhesive 200 and solder material 300 which are used to join a first substrate 110 to a second substrate 120.

The substrates 110, 120 are the materials that require bonding to one another. The substrates 110, 120 may be composed of the same or differing material compositions. Typical substrate materials include aluminum, steel, magnesium, composite, or the like.

The adhesive 200 is a structural material used to bond a contact surface 115 of the first substrate 110 to a contact surface 125 of the second substrate 120. The adhesive 200 forms a bonded area (more often referred to a bond line 210, seen in a cross sectional view) between the contact surfaces 115, 125. In FIGS. 1 and 2, the bond line 210 extends laterally between the substrates 110, 120 and has a thickness 212.

The bond line 210 forms when heat and/or pressure are applied to the at least one of the substrates 110, 120. Alternately, the bondline 210 can form by the system 100 being heated without bringing a heating element into direct contact with either substrate, e.g., placing the system 100 in an oven.

As stated above, bond line uniformity is critical in designing a bond joint since uniformity within the bond line is important for optimal to the performance of an adhesive. Some literature contemplates that thin bond lines are preferred over thick bond lines, because the stress concentration at a joint corner is smaller in thin bond lines. Additionally, air cavity concentration is reduced in thin bond lines as compared to thick bond lines because the volume of the adhesive in thin bond lines leaves less room for air cavities to form.

In the present disclosure, the thickness 212 approximately between about 0.05 to about 0.3 millimeters (mm). As an example, if the contact surfaces 105, 115 are relatively flat, the bond line 210 may have a thickness 212 of approximately 0.2 mm to allow for optimal shear and tensile strength.

In some embodiments, it is desirable for bonded substrates 110 120 to be separable after assembly. To allow for reversibility in the bond, the composition of adhesive 200 may include materials whose strength decreases upon the application of a triggering energy, such as heat.

Adhesives based on thermoplastic polymers (referred to as thermoplastic adhesive hereafter) are useful in scenarios where disassembly of bonded components, e.g., system 100, is desired since thermoplastic adhesive softens when heated above a threshold temperature. Separable thermoplastic adhesive eliminates traditional mechanical fasteners (e.g., bolts, nuts) and simplifies design in hermetically sealed assemblies that require subsequent access to components after assembly.

Thermoplastic adhesives soften when heated to allow for ease of disassembly. Heating the same thermoplastic adhesive after disassembly allows the thermoplastic adhesive to re-bond, thus allowing the same adhesive to be reused during multiple assembly-disassembly cycles. However, thermoplastic adhesives, due to the easy malleability, decrease in strength at moderately high temperatures.

In some embodiments, the adhesive 200 includes the thermoplastic material, to allow disassembly and reassembly of the system 100, as well as the solder material 300, to increase the strength of the thermoplastic adhesive under ambient temperature and elevated temperature, for example. In thermoplastic material embodiments, the solders balls 300 may melt and solidify in a temperature range similar to where the thermoplastic material softens and solidifies. For example, the system 100, when bonded with the separable thermoplastic adhesive, can be disassembled, reworked, and reassembled on a manufacturing line in scenarios where repair is needed.

Further embodiments and arrangements of the adhesive 200 are described below, in association with FIGS. 1-4 and FIG. 12.

The solder material 300 are used in conjunction with the adhesive 200 to form a bridge between the substrates 110, 120. Unlike prior art, which may incorporate glass beads within structural adhesives, the present technology promotes bonding of the substrates 110,120 using the adhesive 200 with the solder material 300.

The solder material 300 have the ability to bond to at least one of the substrates 110, 120 during manufacturing process (e.g., a curing process). Using solder material 300 enables a crack 220 to propagate along a fracture path 222, 224, or 226, described below, which requires more fracture energy for crack propagation in the adhesive 200 and increases energy-absorption capability of the system 100.

The solder material 300 may be covered by a layer of adhesive 200 such that the solder material 300 is not in direct contact with either or both of the contact surfaces 115, 125 upon assembly. However, during subsequent manufacturing processes (e.g., heating and pressing), the adhesive 200 becomes malleable and displaces to allow the solder material 300 to establish contact with one or both of the contact surfaces 115, 125.

Incorporating solder material 300 within the adhesive 200 also improves fracture resistance of a bond joining the substrates 110, 120. As an example, a fracture threshold in an adhesive without solder material may occur approximately near 1.8 newtons per millimeter (N/mm), whereas the same fracture in adhesive containing solder material may occur at approximately near 11.5 N/mm.

The embodiments and the examples provided herein illustrate and describe the solder material 300 as spherical in shape (e.g., solder balls), which promotes uniform distribution of the solder material 300 from adjacent solder material 300 throughout the adhesive 200. However, the solder material 300 may include other shapes such as, but not limited, to cylinders, rectangles, and the like. Using shaped solder material 300 may be beneficial in applications, for example, (1) where desired contact of the solder material 300 is only to one of the contact surfaces 115, 125, (2) the solder material 300 are specifically placed on the substrates 110, 120 (e.g., through a manufacturing process—e.g., hot/cold spray), or (3) the solder material 300 is strategically placed within the adhesive 200 (e.g., through a manufacturing process—e.g., hot/cold spray).

In some embodiments, the solder material 300 can be combined with the adhesive 200 prior to bonding the second contact surface 125. For example, the adhesive 200 and the solder material 300 may create an adhesive-solder mixture, which can be stored until the mixture is dispensed onto the first contact surface 115. As another example, the adhesive 200 and the solder material 300 may create an adhesive-solder tape, where the adhesive 200 is in the form of a double-sided tape with the solder material 300 embedded within tape. To facilitate bonding, the solder-adhesive tape can be laid onto the first contact surface 115 before bonding the second contact surface 125.

The solder material 300 should be of a dimension that allows contact to at least one of the substrates 110, 120. If contact to both of the substrates 110, 120 is desired, the solder material 300 can be configured to have a dimension slightly larger than the bond line 210.

For example, when the solder material 300, if the bond line 210 has a thickness 212 of 0.2 mm, the solder material 300 may be a solder ball having a dimension of approximately near 0.2 mm or larger, to ensure compression of the solder material 300 during bonding, which will ensure adequate joining to contact surfaces 115, 125.

If contact is desired only on one of the substrates 110 or 120, it may be desirable to have the solder material 300 of a dimension slightly smaller than the bond line 210. As an example, if the bond line thickness 212 is approximately 0.2 mm, the solder material 300 may be a solder ball with a dimension of approximately 0.1 mm, to ensure that the solder material 300 are not large enough do not contact both surfaces 115, 125 during bonding. For example, the solder material 300 may be secured to the second contact surface 125 (seen in FIG. 2) during a manufacturing process such that when the adhesive 200 is applied, the solder material 300 are only in contact with the contact surface 125, and only the adhesive 200 is in contact with the first contact surface 115.

The solder material 300 may be composed of any commercially available material or a custom composition. When at least one of the substrates 110,120 is at least partially composed of metal and/or metal composites, composition materials of the solder material 300 may include materials such as tin (Sn), lead (Pb), silver (Au), copper (Cu), zinc (Zn), bismuth (Bi), and/or the like. If at least one of the substrates 110,120 is at least partially composed of polymer and/or polymer composites, the solder material 300 composition may also include polymer materials such as polycarbonate (PC), polyethylene (PE), polypropylene (PP), divinylbenzene (DVB), and/or the like.

Desirable characteristics of the solder material 300 include, but are not limited to (1) a density conducive for bonding, (2) a temperature conducive for bonding, and (3) increased tensile strength over prior art.

The density should be such that the solder material 300 maintain its structure when incorporated into the adhesive 200 prior to bonding. The solder material 300 density can be approximately between about 2.50 and about 15.00 g/cm$^3$.

For example, a solder ball containing tin-lead (Sn—Pb) or tin-silver-copper (Sb—Ag—Cu or SAC) may have a density approximately near 7.5 g/cm$^3$, which may provide adequate density for bonding when at least one of the substrates 110,120 is at least partially composed of metal and/or metal composites. As another example, a solder ball containing ethenylbenzene or divinylbenzene (DVB) may have a density approximately near 0.9 g/cm$^3$.

The temperature should be such that the solder material 300 bond without affecting (e.g., deforming) composition materials of the substrate 110, 120. The solder material 300 bonding temperatures can be approximately between about 0.7 and 1.0 of a melting temperature of the solder material 300. In some embodiments it is desirable to include solder material that has a melting point of less than 200° C. to prevent de-bonding (e.g., fracture) of the solder material 300 from the contact surfaces 115, 125.

Tensile strength should increase strength of the system 100 under tension forces when compared to an adhesive without filler material or an adhesive containing non-bonding filler material. For example, when solder material 300 are used in conjunction with the adhesive 200, the overall system 100 may have a tensile strength of approximately between about 50 MPa and 150 MPa, whereas an automotive adhesive alone may have a tensile strength of approximately between about 15 MPa and 35 MPa, and an automotive adhesive with glass beads may have a tensile strength of approximately between about 15 MPa and 35 MPa.

In some embodiments, the solder material 300 may be in the form of a mesh 310 of solder material (as seen in FIG. 13). Using the mesh 310 may be beneficial in applications, for example, where the adhesive 200 contains thermoplastic polymer materials.

The mesh 310 may be composed partially of any combination of solder material such as, but not limited to, solder wire, solder balls, solder disks, and the like. The mesh 310 can be a continuous mesh or web of solder material, for example, a solder wire mesh include solder balls or alternate shape. In some embodiments, the mesh 310 can include non-solder materials such as polymers or thermoplastics to assist in the structure of the mesh or to facilitate in the bonding of the mesh 310 and adhesive with the substrates 110, 120.

The mesh 310 should be of a thickness 315 that facilitates bonding of the combination of the adhesive 200 and the mesh 310 to at least one of the substrates 110, 120. The thickness 315 may increase to a point that the mesh 310 can facilitate bonding between both of the substrates 110, 120.

The solder material 300 may be configured and arranged according to any of various embodiments described herein, including below in association with FIGS. 6-10 and FIG. 13.

II. Structural Adhesive Embodiments—FIGS. 1 Through 6

In some embodiments, the bond line thickness 212 is such that the solder material 300 may join to both of the contact surfaces 115, 125 (seen in FIG. 1). Joining the solder material 300 to both contact surfaces 115, 125 has benefits including promoting a crack 220 that propagates in the adhesive 200 approximately near solder material 300 according to a fracture path that requires the greatest amount fracture energy (i.e, the amount of energy required to commence a crack—e.g., crack 220). The crack 220 may (i) propagate along a pre-identified fracture path 222 (depicted as a series of short solid arrows in FIG. 1), (ii) propagate along a pre-identified fracture path 224 (depicted as a series of dashed arrows in FIG. 1), (iii) propagate along a pre-identified fracture path 226 (depicted as a series of long solid arrows in FIG. 1), or (iv) arrest at the interface of the adhesive 200 and the solder material 300.

The fracture paths 222, 224, 226 correlate generally to a path of greatest resistance for any fracture. Because the adhesive 200 is generally weaker than the substrates 110, 120 and the solder material 300, the fracture paths may extend through the adhesive 200 as illustrated by the fracture paths 222, 224 or along one of the contact surfaces as illustrated by the fracture path 226.

When the crack 220 propagates around each solder material 300, the fracture path 222 is formed along one of contact surfaces 115, 125, as shown in FIG. 1. Although FIG. 1 depicts the fracture path 222 extending around each solder material 300 toward the first contact surface 115, alternatively, the fracture path 222 could extend around any one or more of pieces of solder material 300 toward the second contact surface 125. Although FIG. 1 depicts the fracture path as continuing around each subsequent solder material 300, in actuality, when the fracture path 222 approaches each subsequent solder material 300, the fracture path 222 may (i) travel around the solder material 300, (ii) travel through the solder material 300, (iii) travel along one of the contact surface 115, 125, or (iv) arrest at the interface of the adhesive 200 and the solder material 300.

The fracture path 224 is formed when the crack 220 propagates through the solder material 300 and then propagates into the adhesive 200 prior to reaching a subsequent solder material 300. Similar to the fracture path 222, when the fracture path 224, reaches each subsequent solder material 300, the fracture path 224 may (i) travel around the solder material 300, (ii) travel through the solder material 300, or (iii) travel along one of the contact surface 115, 125, or (iv) arrest at the interface of the adhesive 200 and the solder material 300.

The fracture path 226 is formed when the crack 220 propagates around the solder material 300 and along one of the contact surfaces 115,125. Unlike the fracture paths 222, 224, when the fracture path 226 is formed, the crack 220 continues to propagate along the contact surface 115, 125 where the crack 220 commenced.

Alternately, the crack 220 may arrest at any interface of the adhesive 200 and the solder material 300 along the paths 222, 224, 226. Arresting of the crack 220 may be highly desired within the system 100 because reduced or eliminated propagation of the crack 220 may prevent failure of the system 100 due to fracture.

In some embodiments, the bond line thickness 212 is such that the solder material 300 join to only one of the contact surfaces 115, 125 (seen in FIG. 2). A benefit of restricting solder material 300 contact to one contact surface 115 or 125 is the ability to join dissimilar substrate materials (e.g., metal material joining with a composite material—e.g., polymer composite) without compromising the integrity of either substrates 110, 120.

Additionally, joining the solder material 300 to one of the contact surfaces 115, 125 propagates a crack 230 within the adhesive 200 approximately near solder material 300, along a fracture path that requires the most fracture energy (e.g, the amount of energy required to commence the crack 230). The crack 230 may (i) propagate along a pre-identified fracture path 232 (depicted as a series of solid arrows in FIG. 2), (ii) propagate along a pre-identified fracture path 234 (depicted as a series of dashed arrows in FIG. 2), or (iii) arrest at the interface of the adhesive 200 and the solder material 300, described below.

In some embodiments, it is desirable to reduce the volume of structural adhesive 200 used in the bonding process.

Reducing the volume of the adhesive 200 can be beneficial by leading to a thinner bond line 210. Additionally, reducing the volume of the adhesive 200 results in adhesive material savings. Other benefits of using less adhesive can include streamlining manufacturing processes and allowing the adhesive to be used on a greater amount surface area.

In some embodiments, the amount of adhesive 200 used may be reduced by the presence of a substrate surface adaptation—e.g., a protrusion, projection, bump, or protuberance 130 (shown in FIG. 2). The protuberance 130 may be positioned on at least one of the contact surfaces 115, 125 to reduce the amount of the adhesive 200 applied. The protuberance 130 illustrated in FIG. 2 may be adhered to the substrates 110, 120 during a manufacturing process or, in the case of sheet metal, the protuberance 130 may be thermally pressed, or otherwise formed, into the protuberance 130 during a sheet forming process.

The protuberance 130 promotes shear loading, generally in a direction included to the substrates 110, 120, for the adhesive 200 in a transition zone 235, described below, to arrest crack propagation in the adhesive 200 and increase energy-absorption capability of the system 100. Fracture path propagation due to presence of protuberances 130 is also described below.

Where the first substrate 110 has a different composition than the second substrate 120, bonding the substrates 110, 120 according to the present technology may have an added benefit of enhanced strength at the bond line 210 compared to prior art. Specifically, e.g., the bond line 210 is stronger with the incorporation of solder material 300 because the energy required to initiate fracture path propagation around the solder material 300 is higher than the energy required for fracture path propagation in the adhesive alone or along an adhesive/metal interface.

As mentioned above, the crack 230 may propagate along the fracture path 232. The fracture path 232 may propagate around each solder material 300 as well as any protuberances 130 along one of the contact surfaces 115, 125. Forcing the fracture path 232 to change directions along the contact surface 115 forms a transition zone 235, being an area between the top surface of protuberances 130/solder material 300 and the opposite contact surface (i.e., the first contact surface 115 in the example of FIG. 2). This transition zone 235 forces fracture propagation in the form of shear fracture because the path of least resistance for any fracture ends up being around the solder material 300 and through the adhesive instead of through the solder material 300. Although FIG. 2 depicts the fracture path 232 as continuing around each subsequent solder material 300 or protuberance 130, in actuality, when the fracture path 232 approaches each subsequent solder material 300, the fracture path 232 may (i) travel around the solder material 300, (ii) travel through the solder material 300, or (iii) arrest at the interface of the adhesive 200 and the solder material 300.

The crack 230 may alternately propagate along the fracture path 234, where propagation occurs through the solder material 300 but around the protuberances 130. As the crack 230 propagates through a solder material 300, the fracture path 234 the transition zone 235 is not created as with fracture path 232. However, the transition zone 235 is created when the fracture path 234 encounters the protuberance 130, and must change direction along the contact surface 115.

Alternately, the crack 230 may arrest at any interface of the adhesive 200 and the solder material 300 along the paths 232, 234. Arresting of the crack 230 may be highly desired within the system 100 because reduced or eliminated propagation of the crack 230 may prevent failure of the system 100 due to fracture.

In some embodiments, it may be desirable to reduce distortion deformation during bonding. Distortion deformation may occur, e.g., when substrates 110, 120 have different coefficients of thermal expansion. The difference in thermal expansion rate can cause distortion internal to each of the substrates 110, 120, which can lead to de-bonding (e.g., fracture) of the bondline 210.

In some embodiments, the surface adaptation may include a groove 140 (shown in FIG. 3). The groove 140 may be embossed into each of the substrates 110, 120 during a manufacturing process. Or, in the case of sheet metal, the groove 140 may be thermally pressed, or otherwise formed, into the substrates 110, 120 during a sheet forming process.

Similar to the protuberance 130, the groove 140 changes the loading condition of the assembly 100, between the first substrate 110 and the second substrate 120, from a peel fracture condition into a shear fracture condition, as a crack propagates along the bondline 210. However, the combination of the groove 140 and the solder material 300 may be enough prevent a crack from forming and/or propagating through the adhesive 200, since the solder material 300 are more ductile than the adhesive 200.

The groove 140 may be defined generally as by a shape on one or both of the substrates 110, 120. The groove 140 may be square or round (as seen in FIG. 3) or another geometric shape, and have an associated depth 145 therewith to reduce distortion within the substrates 110, 120.

When the groove 140 is rounded, the shape defines a concave groove generally, as depicted in FIG. 3. However, it should be appreciated that the groove 140 may also define a generally convex groove. The depth 145 associated with a rounded groove may be a value such that the substrates 110, 120 are not distorted during bonding. An acceptable depth 145 for a rounded groove is in some embodiments a fractional value of the substrate 110, 120 thickness up to a value multiple times the substrate 110, 120 thickness. For example, the groove 140 may be between approximately 0.05 mm and approximately 10 mm, measured from the base of the groove 140.

When the groove 140 is square, the shape generally defines a square groove with a rounded edge, as depicted in FIG. 3. However, it should be appreciated that the groove 140 may also define a square groove with other transition edges—e.g., square, linear, or the like. The depth 145 associated with a square groove may be a value such that the substrates 110, 120 are not distorted during bonding. An acceptable depth 145 for a square groove is in some embodiments a fractional value of the substrate 110, 120 thickness up to a value multiple times the substrate 110, 120 thickness. For example, the groove 140 may be between approximately 0.05 mm and approximately 10 mm, measured from the base of the groove 140.

It should be appreciated that one or both of the substrates 110, 120 may include several surface adaptations (e.g., protuberance 130 and groove 140) at intermittent intervals (e.g., distance 147 seen in FIG. 3) along a longitudinal axis. An intermittent interval, such as distance 147, should be such that one groove 140 is adequately spaced from a subsequent groove 140. An acceptable distance 147 may be a value between approximately 10 mm and approximately 100 mm.

Although the grooves 140 are designed to prevent deformation and facilitate secure bonding of the substrates 110, 120 to prevent fracture, when fracture does occur a crack may propagate along fracture paths described above. Specifically, when the solder material 300 are in contact with both the substrates 110, 120, as seen in FIG. 1, the fracture paths would be similar to fracture paths 222, 224, and/or 226, described in association with FIG. 1. However, when the solder material 300 are in contact with only one of the substrates 110, 120, as seen in FIG. 2, the fracture paths would be similar to fracture paths 232 and/or 234, described in association with FIG. 2.

FIG. 4 illustrates load, γ(N/mm) [y axis], versus displacement, δ (mm) [x axis], of (i) an adhesive with no solder balls (represented by a first data line 312), (ii) an adhesive containing solder balls in contact with one substrate surface (represented by a second data line 314), and (iii) an adhesive containing solder balls in contact with both substrate surfaces (represented by a third data line 316). As seen, generally, the first data line 312 has a surface tension that is below that of the second and third data lines 314 and 316, thus making the adhesive prone to fracture when compared with the adhesives containing solder balls. The surface tension of the second and third data lines 314 and 316 vary depending on displacement of the adhesive, thus making the choice of single contact solder balls or double contact solder balls a preference derived from the application and use of the adhesive.

In some embodiments, reduction in the amount of adhesive 200 used may also be occasioned by creating voids, such as cavities 240 (shown in FIG. 5). Each cavity 240 may be a void, within adhesive 200, of any number of shapes or sizes. FIG. 5 also illustrates an embodiment of the system 100 containing solder material 300 arranged according to a gathered distribution.

The gathered distribution of solder material 300 may be beneficial in applications where the adhesive 200 is reduced in surface area (and thus volume) due to the existence of a void within the adhesive 200, such as the cavity 240 mentioned above. The volume of the adhesive 200 is decreased due to a reduction in a bond line width 214 in pre-identified areas within of the adhesive 200. The distribution density of the solder material 300 increases where the width 214 is the narrowest (e.g., between the cavities 240).

Distribution density may be accomplished by, for example, a dispensing device that controls distribution of the solder material 300. Such a dispensing device may expand a distribution nozzle to generate higher solder material 300 distribution density in areas were the width 214 is narrow and retract the distribution nozzle to generate lower solder material 300 distribution density in remaining areas. The dispensing device may also include a self-control function to open or close the device nozzle. To expand and retract the distribution nozzle, the dispensing device may include items such as but not limited to, electromagnetic device(s), valves, and other mechanical components.

Increasing distribution density, reinforces vulnerable of areas of fracture (e.g., near the cavities 240). By strategically distributing a greater number of the solder material 300 in areas of the reduced bond line width 214, the gathered distribution reduces the volume of the adhesive 200 while promoting shear fracture along a path which requires the greatest amount of fracture energy.

FIG. 6 illustrates levels of energy absorption for apparatus having (i) an adhesive with no solder balls (prior art; represented by a first data block 252), (ii) an adhesive containing solder balls (represented by a second data block 254), and (iii) an adhesive containing solder balls with a reduced adhesive bond line width 214 (represented by a third data block 256).

Each of the data blocks 252, 254, 256 measure the energy absorption, in Joules (J), of each adhesive covering a surface area of 100*25 mm2. The y-axis is marked in increments of 5 J.

As shown, the first data block 252 absorbs energy of approximately near 15 J per the surface area. When solder balls are added to an adhesive (second data block 254), the energy absorption is much higher, approximately near 24 J for the same surface area, an increase of nearly 60%.

When solder balls are added and the bond line width 214 is reduced at least in some areas (e.g., around the cavities 240), the energy absorption is generally the same as the adhesive without solder balls, i.e., data block 252. However, the volume of adhesive used in this latter case is reduced by about 40%. Benefits of using less material are described above.

FIG. 12 is a graph illustrating a strength, measured in megapascals (MPa) versus temperature, measured in ° C., of an adhesive containing (i) thermoplastic material (represented by a first data line 392), and (ii) thermoplastic material including the solder material 300 (represented by a first data line 394).

As seen in FIG. 12, the thermoplastic adhesive seen in data line 392 begins to increasingly lose strength near 80° C., and near 90° C., the thermoplastic adhesive loses a substantially majority of strength. The thermoplastic adhesive containing the solder material 300, seen in data line 394, also begins to lose strength near 80° C. However, the solder material 300 keep the strength of the adhesive bond from degrading until temperatures of approximately 120° C. The strength of the adhesive bond could degrade up to 300° C., depending on the melting temperature of the composition of the solder alloy.

III. Solder Material Embodiments—FIGS. 7 Through 11 and FIG. 13

In some embodiments, the outer surface of the solder material 300 contain a partial or full coating 320, shown in FIG. 7, such as a flux. The coating 320 is selected and applied to improve the bonding and/or the controlled fracture characteristics of the system. The coating 320 in some cases does this by enhanced bonding of the interface between the solder material 300 and the contact surfaces 115, 125, the enhanced bonding forcing the cracks 220, 230 to either alter the path of fracture or arrest propagation, as described above.

Where the solder material 300 is in the form of the mesh 310, and possesses a top surface, intended to be in contact with the first contact surface 115, and a bottom surface, intended to be in contact with the second contact surface 125, different coatings may be applied to the solder material 300 on one or both of the continuous surfaces of the mesh 310. Coatings may be beneficial where material of the substrates 110, 120 are dissimilar or both substrates 110, 120 benefit from the interface created between the solder balls 300 and the coatings.

The coating 320 may also be utilized arrest (i.e., stop) fracture propagation through the adhesive 20. Alternately, the coating 320 may deflect fracture propagation to another feature contained within the adhesive 200 (e.g., solder material 300 or protuberance 130) to promote failure in shear mode through the adhesive 200 adjacent the solder material 300.

In some embodiments, the coating 320 improves the interface between the solder material 300 and the substrates 110, 120 through removing impurities at the site of the bond (e.g., dirt, oil or oxidation). The improved interface promotes fracture propagation around solder material 300 in addition to the promotion of the fracture paths already occasioned by the general design (e.g., fracture paths 222, 224, 226 in FIG. 1 and fracture paths 232, 234 in FIG. 2).

The coating 320 may be a cleaning agent that promotes soldering, brazing, or welding by removing oxidation from the metals to be joined. Materials suitable for include but are not limited to ammonium chloride, rosin (natural or chemically modified), hydrochloric acid, zinc chloride, and borax.

FIG. 8 illustrates load, $\gamma$ (N/mm) [y axis], versus displacement, $\delta$ (mm) [x axis], of (i) an adhesive containing solder balls without flux (represented by a first data line 332), and (ii) an adhesive containing solder balls with flux (represented by a second data line 334). As seen, generally, the first data line 332 has a surface tension that is below that of the second data line 334, showing that a bond may withstand greater force prior to fracture when a coating such as coating 320 is used prior to bonding.

In some embodiments, the solder material 300, whether coated, may be distributed in patterns and designs, which may function to strengthen the bonding of the substrates 110, 120 by reducing stress concentrations within the bonding system 100. Stress concentrations may be formed where solder material 300 cluster in the same area of the adhesive 200. Creating patterns with the solder material 300 may prevent clusters of solder material 300 from forming though intentional placement of each solder material 300.

Distribution of the solder material 300 may occur in conjunction with new or existing manufacturing or assembly processes, which spray adhesives, coatings, waxes, or the like. Spray processes such as hot/cold and the like may be used to distribute the solder material 300 into patterns on substrates 110, 120 or within the adhesive 200. Additionally, the solder material 300 that contain patterns may also contain the coating 320 discussed above to facilitate removal of impurities.

FIG. 9 illustrates a top view of an embodiment of the system 100 containing solder material 300 with a linear distribution. The balls 300 may be coated as described above in connection with FIG. 7, through such coating is not shown in detail in FIG. 9.

In the linear distribution of FIG. 9, each of the solder material 300 is separated by a horizontal distance 340 (distance between two solder material 300 on the same column) and a vertical distance 350 along the bond line width 214 (distance between two solder material 300 on the same row). As provided, references to direction (e.g., horizontal, vertical) are provided to aid in the present descriptions and not necessarily to limit application of the present technology or orientation of constituent parts before, during, or after the bonding process.

Positioning the solder material 300 with a linear distribution generates a fracture path 260 (depicted as a series of arrows in FIG. 9) to propagate in a way that propagates a crack along a fracture path requiring the greatest amount of fracture energy. Similar to the fracture paths 222, 224, 226 (seen in FIG. 1), the fracture path 260 may propagates around each solder material 300, forcing the fracture path 260 along at least one of the contact surfaces 115, 125. The fracture path 260 can alternatively propagate along any row of the solder material 300 to allow the shear fracture to occur.

FIG. 10 illustrates an alternate embodiment of the system 100 containing solder material 300 with a meandering distribution. The meandering distribution is formed the solder material 300 forming two meandering patterns, oriented in opposite directions.

As with the linear distribution, the solder material 300 within the meandering distribution are separated by a horizontal distance 370 and a vertical distance 360. The horizontal distance 360 is the distance between each meandering wave revolution about a centerline (not shown) of the adhesive width 214. The vertical distance 370 is the distance between the centerline of the adhesive width 214 and the outermost solder material 300 of the sine formation.

Positioning the solder material 300 with a meandering distribution generates a fracture path 270 (depicted as a series of arrows in FIG. 10) to propagate in a way that facilitates a shear fracture instead of a peel fracture. The fracture path 270 propagates around each solder material 300 within a single sine within the meandering distribution. The fracture path 270 can alternatively propagate along the second sine within the meandering distribution to allow the shear fracture to occur. Due to the pattern formed by the meandering distribution the fracture path 270 is longer than the fracture path when compared to the fracture paths 222, 224, 226 (shown in FIG. 1) and fracture paths 232, 234 (shown in FIG. 2) formed by the random distribution and the fracture path 260 (shown in FIG. 9) formed by the linear distribution.

To withstand the maximum joint stress without creating stress concentrations, there exists a correlation between the horizontal distance 340 and the vertical distance 350 within the linear distribution. A similar correlation is also true for the horizontal distance 360 and the vertical distance 370 within the meandering distribution. For example, in the linear distribution, the correlation may have a ratio approximately a 1:1, whereas in the meandering distribution, the correlation may have a ratio approximately near 1:4.

FIG. 11 illustrates load, $\gamma$ (N/mm) [y axis], versus displacement, $\delta$ (mm) [x axis], of (i) an adhesive with no solder balls (represented by data line 382), (ii) an adhesive containing a random distribution of solder balls (represented by data line 384), (iii) an adhesive containing a linear distribution of solder balls (represented by data line 386), and (iv) an adhesive containing a meandering distribution of solder balls (represented by data line 388).

As seen, generally, the data line 382 has a surface tension that is below that of the data lines 384, 386, 388. The surface tension of the data line 384 has a surface tension that gradual increases and decreases with displacement, whereas the data lines 386 and 388 have surface tension that gradually decrease with displacement, thus making the linear distribution and the meandering distribution suitable for some applications such as bonds where the substrates 110, 120 are different materials.

IV. Selected Features

Many features of the present technology are described herein above. The present section presents in summary some selected features of the present technology. It is to be understood that the present section highlights only a few of the many features of the technology and the following paragraphs are not meant to be limiting.

The technology allows bond line uniformity to be accomplished within the structural adhesive. Bond line uniformity can achieve optimal tensile and shear strength as well as regulate the thickness of the bond line, which reduces the volume of adhesive required in applications. Reducing the volume of the adhesive can be beneficial to form a thinner bond line. Additionally, reducing the volume of the adhesive, can result in a material savings.

The technology allows enhanced contact of the structural adhesive with the substrate material. Enhancing contact of the structural adhesive allows the substrate materials to bond more effectively the adhesive creating a more secure bond, which can withstand a greater force prior to fracture. The addition of solder to thermoplastics adhesive retains the reversibility allowing for repeated assembly and disassembly while enhances the joint strength under ambient temperature and under elevated temperature.

The technology allows fracture to propagate along a path that requires the greatest amount of fracture energy. Unlike glass beads, which facilitate fracture perpendicular to the substrate materials, fractures that occur in a direction generally inclined toward substrate materials facilitate a shearing effect where substrate materials remain on the same plane.

V. Conclusion

Various embodiments of the present disclosure are disclosed herein. The disclosed embodiments are merely examples that may be embodied in various and alternative forms, and combinations thereof.

The above-described embodiments are merely exemplary illustrations of implementations set forth for a clear understanding of the principles of the disclosure.

Variations, modifications, and combinations may be made to the above-described embodiments without departing from the scope of the claims. All such variations, modifications, and combinations are included herein by the scope of this disclosure and the following claims.

What is claimed is:

1. A method, to produce a solder-reinforced adhesive bond joining a first substrate and a second substrate, comprising:
    applying, on a first contact surface of the first substrate, an adhesive;
    positioning, at least partially into the adhesive, a solder mesh, such that the solder mesh contacts the first contact surface;
    connecting, to a portion of the adhesive opposite the first contact surface, a second contact surface of the second substrate; and
    applying heat to the first contact surface such that at least one portion of the solder mesh reaches a solder-bonding temperature.

2. The method of claim 1, wherein the solder mesh is positioned in a distribution (i) arresting crack propagation or (ii) promoting crack propagation along a path requiring, in at least one section of the bond, a greatest amount of fracture energy.

3. The system of claim 1, wherein at the solder mesh comprises a coating configured to (i) arrest crack propagation in the adhesive or (ii) deflect crack propagation to promote failure in a shear direction through the adhesive adjacent the at least one portion of the solder mesh.

4. The method of claim 1, wherein the solder mesh is further positioned in contact with the second contact surface.

5. The method of claim 4, further comprising applying heat to the second contact surface such that the at least one portion of the solder mesh reaches the solder-bonding temperature.

6. The method of claim 4, wherein the solder mesh is positioned in a distribution (i) arresting crack propagation or (ii) promoting crack propagation along a path requiring, in at least one section of the bond, the greatest amount of fracture energy.

7. The method of claim 4, wherein the solder mesh comprises a coating configured to (i) arrest crack propagation in the adhesive or (ii) deflect crack propagation to promote failure in a shear direction through the adhesive adjacent the at least one portion of the solder mesh.

8. A method, to produce a solder-reinforced adhesive bond between a first substrate and second substrate, comprising:
    positioning, a first surface of a solder mesh in contact with the first contact surface of the first substrate;
    applying, on a second surface of the solder mesh, opposite the first surface of the solder mesh, an adhesive;
    connecting, to a portion of the adhesive, opposite the first contact surface, a second contact surface of the second substrate; and
    applying heat to the first contact surface such that at least one portion of the solder mesh reaches a solder-bonding temperature.

9. The method of claim 8, wherein the solder mesh is positioned in a distribution (i) arresting crack propagation or (ii) promoting crack propagation along a path requiring, in at least one section of the bond, a greatest amount of fracture energy.

10. The method of claim 8, wherein the solder mesh comprises a coating configured to (i) arrest crack propagation in the adhesive or (ii) deflect crack propagation to promote failure in a shear direction through the adhesive adjacent at the least one portion of the solder mesh.

11. The method of claim 8, wherein the solder mesh is further positioned in contact with the second contact surface.

12. The method of claim 11, further comprising applying heat to the second contact surface such that the at least one portion of the solder mesh reaches the solder-bonding temperature.

13. The method of claim 11, wherein the solder mesh is positioned in a distribution (i) arresting crack propagation or (ii) promoting crack propagation along a path requiring, in at least one section of the bond, a greatest amount of fracture energy.

14. The method of claim 11, wherein the solder mesh comprises a coating configured to (i) arrest crack propagation in the adhesive or (ii) deflect crack propagation to promote failure in a shear direction through the adhesive adjacent the at least one portion of the solder mesh.

* * * * *